(12) United States Patent  
Watanabe et al.

(10) Patent No.: US 8,347,901 B2
(45) Date of Patent: Jan. 8, 2013

(54) SUBSTRATE CLEANING METHOD, SUBSTRATE CLEANING SYSTEM AND PROGRAM STORAGE MEDIUM

(75) Inventors: Tsukasa Watanabe, Nirasaki (JP); Naoki Shindo, Nirasaki (JP); Takahiro Furukawa, Tosu (JP); Yuji Kamikawa, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 404 days.

(21) Appl. No.: 11/717,170

(22) Filed: Mar. 13, 2007

(65) Prior Publication Data

US 2007/0215172 A1    Sep. 20, 2007

(30) Foreign Application Priority Data

Mar. 15, 2006  (JP) .................................. 2006-070538

(51) Int. Cl.
*B08B 3/12* (2006.01)
(52) U.S. Cl. ....................... 134/184; 134/56 R; 134/94.1
(58) Field of Classification Search ................. 134/56 R, 134/184, 186
See application file for complete search history.

(56) References Cited

U.S. PATENT DOCUMENTS

| | | | |
|---|---|---|---|
| 5,800,626 A * | 9/1998 | Cohen et al. ................... | 134/1.3 |
| 5,858,106 A | 1/1999 | Ohmi et al. | |
| 6,058,945 A | 5/2000 | Fujiyama et al. | |
| 6,423,146 B1 | 7/2002 | Fukazawa | |
| 6,592,678 B1 | 7/2003 | Kamikawa et al. | |
| 2003/0029479 A1 * | 2/2003 | Asano ............................. | 134/18 |
| 2003/0150477 A1 * | 8/2003 | Suzuki ........................... | 134/1.3 |
| 2003/0188765 A1 | 10/2003 | Christenson et al. | |
| 2003/0230236 A1 * | 12/2003 | Shibayama .................... | 117/200 |

FOREIGN PATENT DOCUMENTS

| | | |
|---|---|---|
| JP | 9-10468 | 1/1997 |
| JP | 10-109072 | 4/1998 |
| JP | 10-109073 | 4/1998 |
| JP | 10-112454 | 4/1998 |
| JP | 10-242107 | 9/1998 |
| JP | 2000077376 A * | 3/2000 |
| JP | 2003031535 A * | 1/2003 |
| JP | 2003-93983 | 4/2003 |
| JP | 2004-22572 | 1/2004 |
| TW | 409305 | 10/2000 |
| TW | 558763 | 10/2003 |

OTHER PUBLICATIONS

Abstract of JP2000-077376A to Saito et al.*
Machine translation of JP2003-031535A to Kawasaki et al.*
Japanese Office Action mailed on Oct. 15, 2010 for Japanese Application No. 2006-070538 with English translation.
Taiwanese Office Action issued on Feb. 24, 2010 for Taiwanese Patent Application No. 96108756 with English translation.

* cited by examiner

*Primary Examiner* — Michael Kornakov
*Assistant Examiner* — Douglas Lee
(74) *Attorney, Agent, or Firm* — Smith, Gambrell & Russell, LLP

(57) ABSTRACT

The present invention provides a substrate cleaning method capable of removing particles from the entire surface of a substrate to be processed at a high removing efficiency. In the substrate cleaning method according to the present invention, a substrate to be processed W is immersed in a cleaning liquid in a cleaning tank 12. Then, ultrasonic waves are generated in the cleaning liquid contained in the cleaning tank 12, so that the substrate to be processed W is subjected to an ultrasonic cleaning process. While the substrate to be processed is being cleaned, a dissolved gas concentration of a gas dissolved in the cleaning liquid contained in the cleaning tank is changed.

3 Claims, 12 Drawing Sheets

SUBSTRATE CLEANING METHOD, SUBSTRATE CLEANING SYSTEM AND PROGRAM STORAGE MEDIUM

CROSS REFERENCE TO RELATED APPLICATIONS

This application is based upon and claims the benefit of priority from the prior Japanese Patent Application No. 2006-70538 filed on Mar. 15, 2006, the entire contents of which are incorporated herein by reference.

BACKGROUND OF THE INVENTION

1. Field of the Invention

The present invention relates to a substrate cleaning method and a substrate cleaning system for removing particles (foreign matters) adhering to a substrate to be processed by immersing the substrate to be processed in a cleaning liquid and generating ultrasonic waves in the cleaning liquid. More particularly, the present invention relates to a substrate cleaning method and a substrate cleaning system capable of removing particles from the entire surface of a substrate to be processed at a high removing efficiency.

The present invention relates also to a program storage medium storing a program for accomplishing a substrate cleaning method capable of removing particles from the entire surface of a substrate to be processed at a high removing efficiency.

2. Description of the Related Art

There is known, from JP10-109072A, for example, a cleaning method, which cleans a substrate to be processed by immersing the substrate held by a holding member in a cleaning liquid and by generating ultrasonic waves in the cleaning liquid. This cleaning method is generally called an ultrasonic cleaning process, and also called a megasonic cleaning process. JP10-109072A describes that, in order to clean a substrate to be processed at a high particle removing efficiency, it is effective to set a dissolved gas concentration of a gas dissolved in a cleaning liquid within a predetermined range.

SUMMARY OF THE INVENTION

Generally, ultrasonic waves are radiated from below a substrate to be processed. Thus, because of a holding member holding the substrate from below which may interfere with the radiation of the ultrasonic waves, there is a possibility that some areas in the substrate are cleaned at a lower particle removing efficiency.

The present invention has been made in view of such a problem and it is therefore an object of the present invention to provide a substrate cleaning method and a substrate cleaning system capable of uniformly removing particles from the entire surface of a substrate to be processed at a high removing efficiency. In addition, it is more preferable that a substrate to be processed is cleaned by the substrate cleaning method and the substrate cleaning system with a simple control.

Another object of the present invention is to provide a program storage medium storing a program for accomplishing a substrate cleaning method capable of uniformly removing particles from the entire surface of a substrate to be processed at a high removing efficiency.

The inventor of the present invention conducted extensive studies regarding a relation between a dissolved gas concentration of a cleaning liquid and a distribution of a particle removing efficiency in a single substrate which had been cleaned in a cleaning liquid by an ultrasonic cleaning process. Then, the inventor found that, with a change in dissolved gas concentrations of the cleaning liquid, a position of an area where particles are easily removed changes in the substrate. The present invention is on the basis of this research.

he substrate cleaning method according to the present invention comprises the steps of: immersing a substrate in a cleaning liquid in a cleaning tank; and cleaning the substrate by generating ultrasonic waves in the cleaning liquid contained in the cleaning tank; wherein, in the step of cleaning the substrate, a dissolved gas concentration of a gas dissolved in the cleaning liquid contained in the cleaning tank is changed. According to the substrate cleaning method of the present invention, particles can be more uniformly removed from a substrate. As a result, a particle removing efficiency can be improved in the substrate to be processed from the overall point of view.

In the substrate cleaning method according to the present invention, in the step of cleaning the substrate, the generation of ultrasonic waves may be stopped for a while, and the dissolved gas concentration may be changed during this intermission. Alternatively, in the substrate cleaning method according to the present invention, in the step of cleaning the substrate, the dissolved gas concentration may be changed while ultrasonic waves are being generated in the cleaning liquid.

In the substrate cleaning method according to the present invention, when the dissolved gas concentration is changed, the dissolved gas concentration of the cleaning liquid may be lowered. In this substrate cleaning method, the dissolved gas concentration can be changed by, for example, additionally adding into the cleaning tank a cleaning liquid of a lower dissolved gas concentration. Thus, the dissolved gas concentration of the cleaning liquid contained in the cleaning tank can be changed by a simple control, and the substrate can be more uniformly cleaned at a high particle removing efficiency.

In the substrate cleaning method according to the present invention, the dissolved gas concentration of the cleaning liquid contained in the cleaning tank may be changed by supplying at least one of a first cleaning liquid and a second cleaning liquid, a dissolved gas concentration of the first cleaning liquid is different from a dissolved gas concentration of the second cleaning liquid. According to this substrate cleaning method, the dissolved gas concentration of the cleaning liquid contained in the cleaning tank can be changed, merely by controlling the flow rates of the first and second cleaning liquids to be supplied into the cleaning tank.

In this example, the first cleaning liquid and the second cleaning liquid may be supplied into the cleaning tank through separate supply pipes. Alternatively, the first cleaning liquid and the second cleaning liquid may be supplied into the cleaning tank through a single supply pipe, after the first cleaning liquid and the second cleaning liquid are mixed with each other.

In addition, in this example, the second cleaning liquid may be generated by deaerating a part of the first cleaning liquid separated from the first cleaning liquid. Alternatively, the first cleaning liquid may be generated by dissolving the gas in a part of the second cleaning liquid separated from the second cleaning liquid.

Alternatively, in this example, the second cleaning liquid may be generated, by means of a deaerator placed in a supply pipe capable of supplying the first cleaning liquid into the cleaning tank, by deaerating the first cleaning liquid passing through the supply pipe. Alternatively, the first cleaning liquid may be generated, by means of a dissolving device placed in a supply pipe capable of supplying the second cleaning liquid into the cleaning tank, by dissolving the gas in the second cleaning liquid passing through the supply pipe.

In addition, it is preferable that the dissolved gas concentration of the first cleaning liquid is the saturated concentration, and the dissolved gas concentration of the second cleaning liquid is 0 ppm. The first cleaning liquid whose dissolved gas concentration is the saturated concentration, and the second cleaning liquid whose dissolved gas concentration is 0 ppm can be relatively easily generated by a simple system and a simple control. Further, the dissolved gas concentration of the cleaning liquid contained in the cleaning tank can be adjusted at a desired concentration, merely by controlling the flow rates of the first and second cleaning liquids to be supplied into the cleaning tank. Thus, it is significantly easy to change the dissolved gas concentration of the cleaning liquid contained in the cleaning tank, and to adjust the dissolved gas concentration of the cleaning liquid contained in the cleaning tank at a desired concentration.

The substrate cleaning system according to the present invention comprises: a cleaning tank that contains a cleaning liquid; an ultrasonic generator that generates ultrasonic waves in the cleaning liquid contained in the cleaning tank; a pipe connected to the cleaning tank so as to supply a first cleaning liquid having a gas dissolved therein and a second cleaning liquid having the gas dissolved therein at a dissolved gas concentration different from a dissolved gas concentration of the first cleaning liquid; and a control device that controls a flow rate of the first cleaning liquid supplied into the cleaning tank and a flow rate of the second cleaning liquid supplied into the cleaning tank, and the generation of ultrasonic waves generated by the ultrasonic generator in the cleaning liquid contained in the cleaning tank; wherein the control device controls, while a substrate to be processed is being cleaned in the cleaning tank, the flow rate of the first cleaning liquid and the flow rate of the second cleaning liquid so as to change a dissolved gas concentration of the cleaning liquid contained in the cleaning tank. According to this substrate cleaning system of the present invention, particles can be more uniformly removed from a substrate. As a result, a particle removing efficiency can be improved in the substrate from the overall point of view.

In the substrate cleaning system according to the present invention, while the substrate is being cleaned, the control device may stop the generation of ultrasonic waves by the ultrasonic generator for a while and change the dissolved gas concentration of the cleaning liquid contained in the cleaning tank during this intermission during this intermission. Alternatively, in the substrate cleaning system according to the present invention, the control device may change the dissolved gas concentration of the cleaning liquid contained in the cleaning tank, while ultrasonic waves are being generated by the ultrasonic generator in the cleaning liquid contained in the cleaning tank.

In the substrate cleaning system according to the present invention, the pipe may include a first supply pipe connected to the cleaning tank so as to supply the first cleaning liquid having the gas dissolved therein, and a second supply pipe connected to the cleaning tank separately from the first supply pipe so as to supply into the cleaning tank the second cleaning liquid having the gas dissolved therein at the dissolved gas concentration different from the dissolved gas concentration of the first cleaning liquid. In this example, it is preferable that the dissolved gas concentration of the first cleaning liquid is the saturated concentration, and the dissolved gas concentration of the second cleaning liquid is 0 ppm. According to this substrate cleaning system, the dissolved gas concentration of the cleaning liquid contained in the cleaning tank can be adjusted at a desired concentration, merely by controlling the flow rates of the first and second cleaning liquids to be supplied into the cleaning tank. The first cleaning liquid whose dissolved gas concentration is the saturated concentration, and the second cleaning liquid whose dissolved gas concentration is 0 ppm can be relatively easily generated by a simple system and a simple control. In addition, the pipe may further include a branching pipe connected to the first supply pipe and the second supply pipe so as to allow a part of the first cleaning liquid flowing through the first supply pipe to separately flow into the second supply pipe, and the deaerator may generate the second cleaning liquid by deaerating the part of the first cleaning liquid. Alternatively, the pipe may further include a branching pipe connected to the second supply pipe and the first supply pipe so as to allow a part of the second cleaning liquid flowing through the second supply pipe to separately flow into the first supply pipe, and the dissolving device may generate the first cleaning liquid by dissolving the gas in the part of the second cleaning liquid.

Alternatively, in the substrate cleaning system according to the present invention, the pipe may include a first supply pipe that supplies the first cleaning liquid having the gas dissolved therein at the saturated concentration, a second supply pipe that supplies the second cleaning liquid having the gas dissolved therein at a dissolved gas concentration of 0 ppm, and a mix and supply pipe connected to the first supply pipe and the second supply pipe, the mix and supply pipe being connected to the cleaning tank, and the mix and supply pipe being capable of mixing the first cleaning liquid and the second cleaning liquid with each other and supplying the same into the cleaning tank. The pipe may further include a branching pipe connected to the first supply pipe and the second supply pipe so as to allow a part of the first cleaning liquid flowing through the first supply pipe to separately flow into the second supply pipe, and the deaerator may generate the second cleaning liquid by deaerating the part of the first cleaning liquid. Alternatively, the pipe may further include a branching pipe connected to the second supply pipe and the first supply pipe so as to allow a part of the second cleaning liquid flowing through the second supply pipe to separately flow into the first supply pipe, and the dissolving device may generate the first cleaning liquid by dissolving the gas in the part of the second cleaning liquid.

Alternatively, in the substrate cleaning system according to the present invention, the pipe may include a supply pipe connected to the cleaning tank, into which pipe the first cleaning liquid having a gas dissolved therein at the saturated condition is introduced, and a deaerator may be placed in the supply pipe, the deaerator being capable of deaerating the first cleaning liquid so as to generate the second cleaning liquid whose dissolved gas concentration is 0 ppm. Alternatively, in the substrate cleaning system according to the present invention, the pipe may include a supply pipe connected to the cleaning tank, into which pipe the second cleaning liquid having the gas dissolved therein at a dissolve gas concentration of 0 ppm is introduced, and a dissolving device may be placed in the supply pipe, the dissolving device being capable of dissolving the gas in the second cleaning liquid so as to generate the first cleaning liquid whose dissolved gas concentration is the saturated concentration.

The program storage medium according to the present invention stores a program executed by a control device for controlling a substrate processing system, so as to accomplish a substrate processing method comprising the steps of: immersing a substrate in a cleaning liquid in a cleaning tank; and cleaning the substrate by generating ultrasonic waves in the cleaning liquid contained in the cleaning tank; wherein, in the step of cleaning the substrate, a dissolved gas concentration of a gas dissolved in the cleaning liquid contained in the cleaning tank is changed.

The program according to the present invention is a program executed by a control device for controlling a substrate processing system, so as to accomplish a substrate processing method comprising the steps of: immersing a substrate in a cleaning liquid in a cleaning tank; and cleaning the substrate by generating ultrasonic waves in the cleaning liquid contained in the cleaning tank; wherein, in the step of cleaning the substrate, a dissolved gas concentration of a gas dissolved in the cleaning liquid contained in the cleaning tank is changed.

DESCRIPTION OF THE PREFERRED EMBODIMENT

A preferred embodiment of the present invention will be described with reference to the accompanying drawings. In the below embodiment, a substrate cleaning system according to the present invention will be described as applied to a semiconductor wafer cleaning system. However, the present inventions is not limited to the semiconductor wafer cleaning system, and can be applied widely to substrate cleaning systems.

FIGS. 1 to 5 are views showing a substrate cleaning method, a substrate cleaning system, a program, and a storage medium in this embodiment of the present invention.

Figure 1:
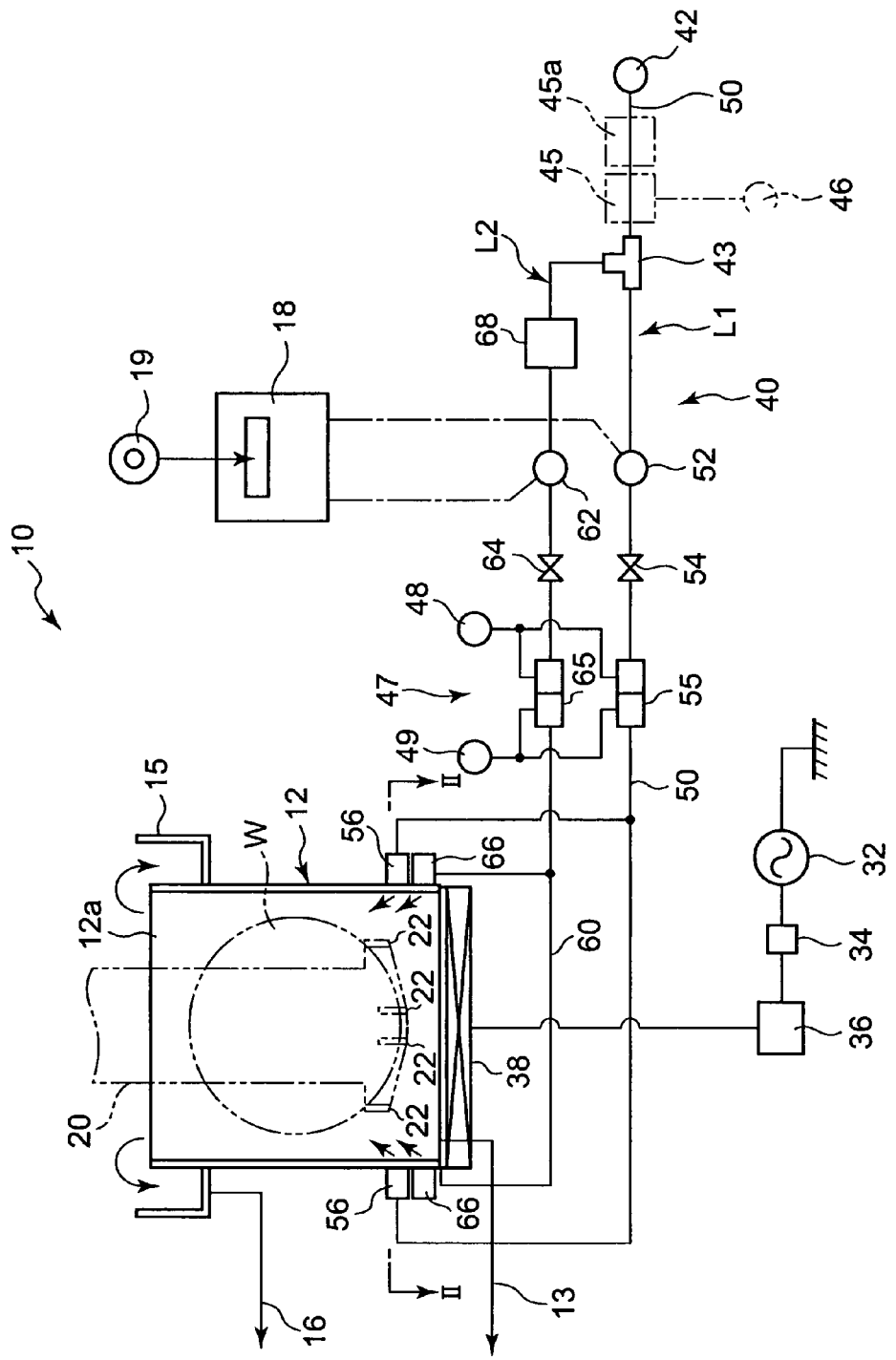
FIG. 1 is a view showing a schematic structure of a substrate cleaning system in one embodiment of the present invention.
Figure 2:
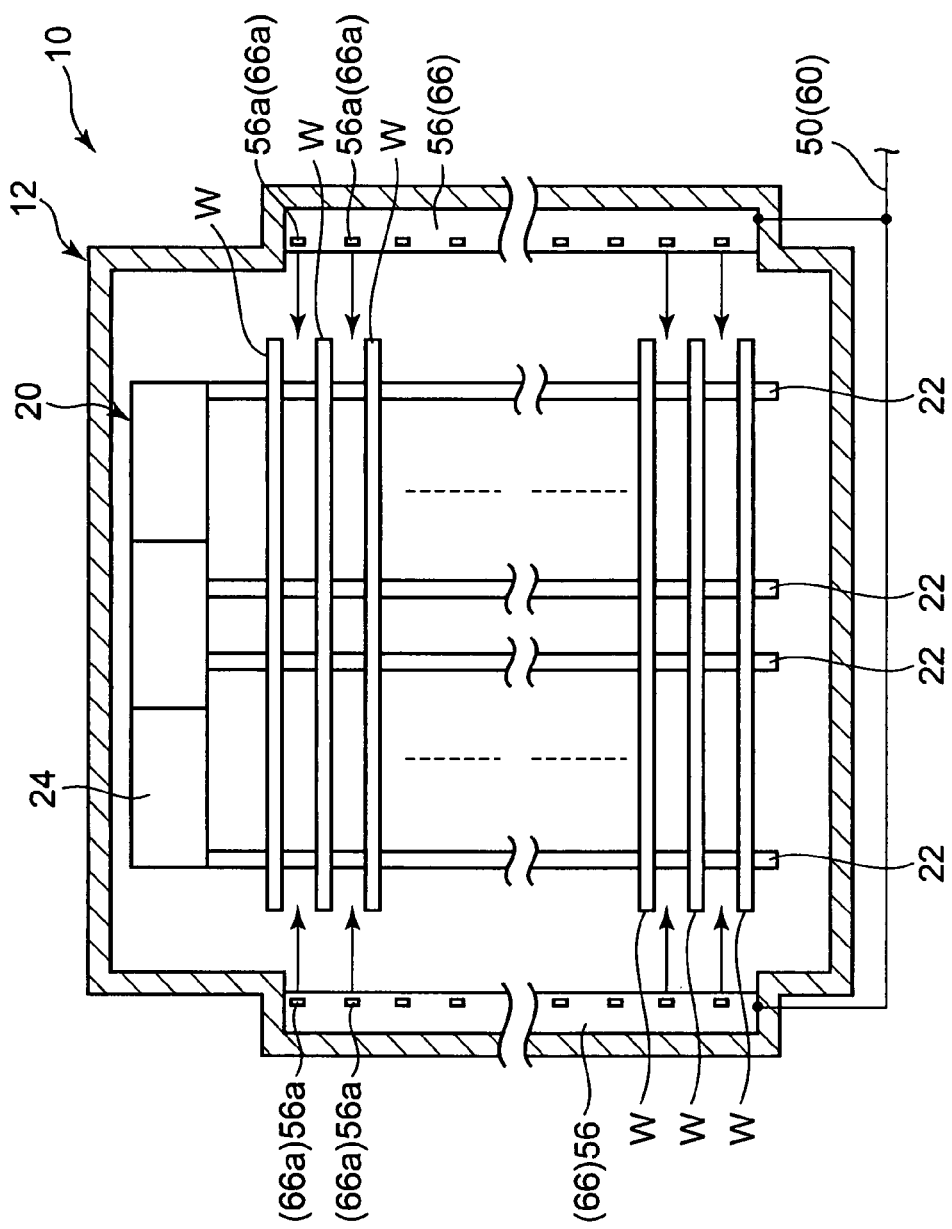
FIG. 2 is a cross-sectional view taken on the line II-II in FIG. 1.
Figure 3:
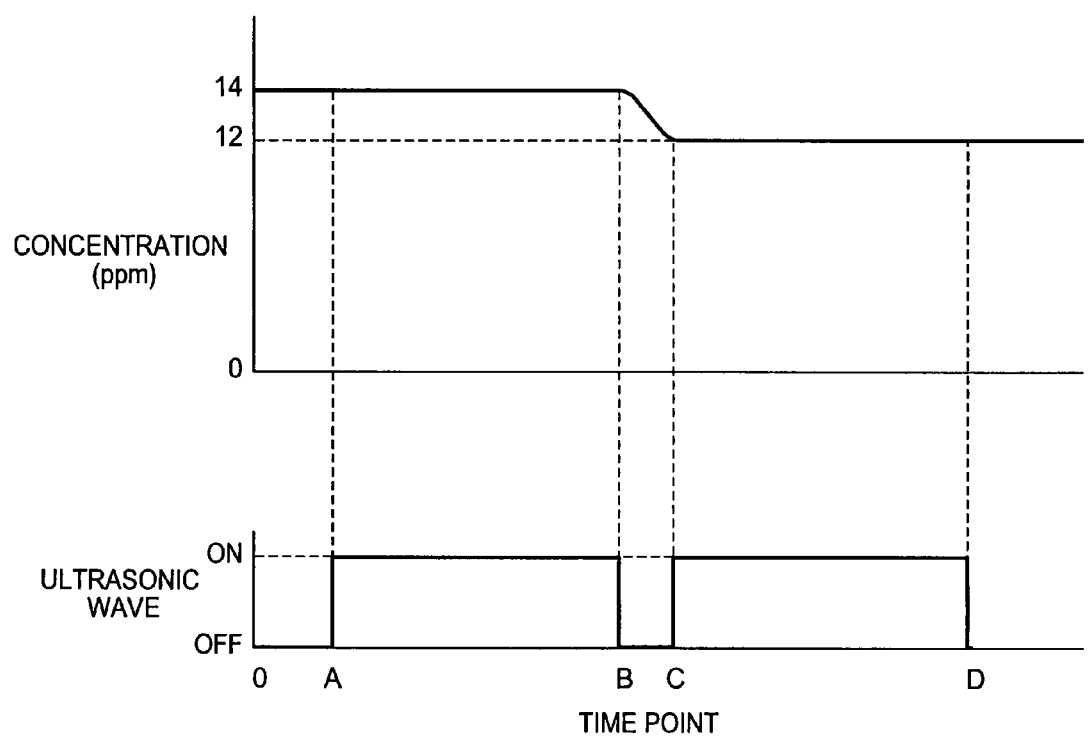
FIG. 3 is a diagram for explaining a change in dissolved gas concentrations of a cleaning liquid contained in a cleaning tank, and an operating mode of an ultrasonic generator, during a cleaning process.
Figure 4:
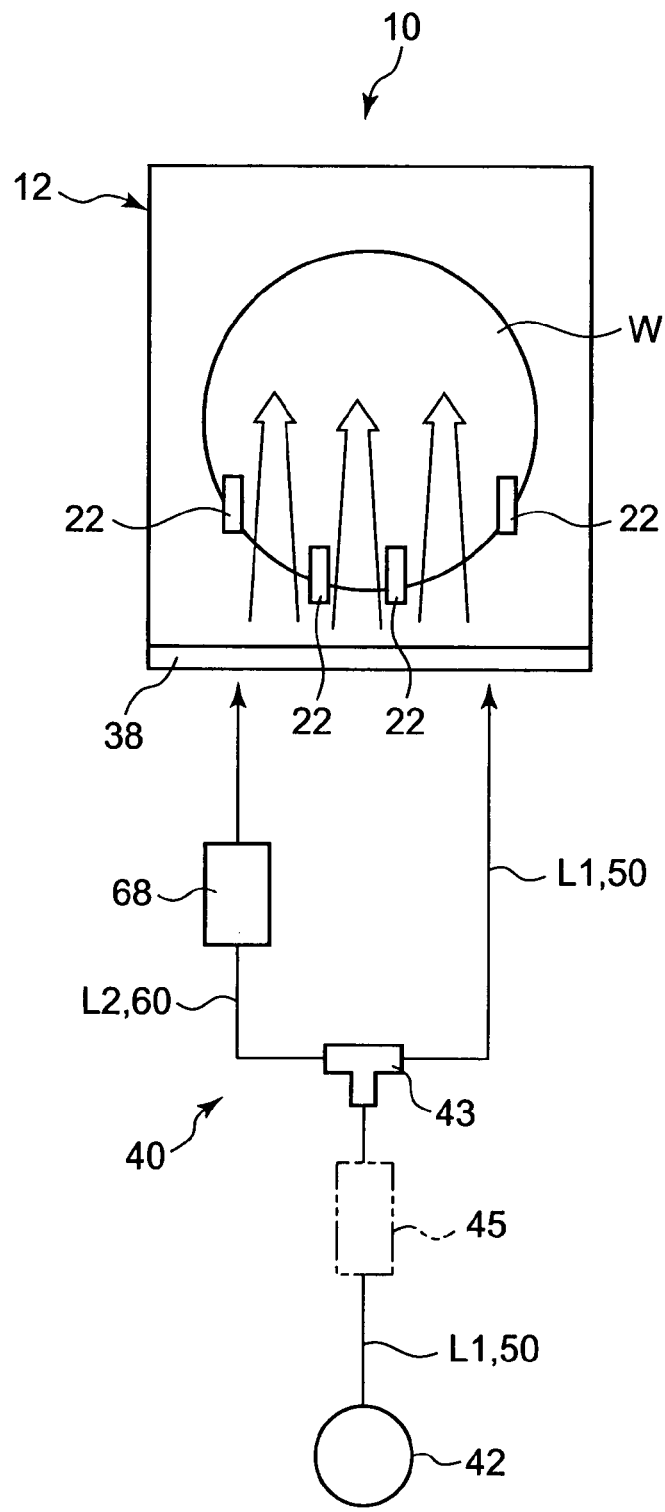
FIG. 4 is a view for explaining a mode of propagation of ultrasonic waves during a cleaning process.
Figure 5:
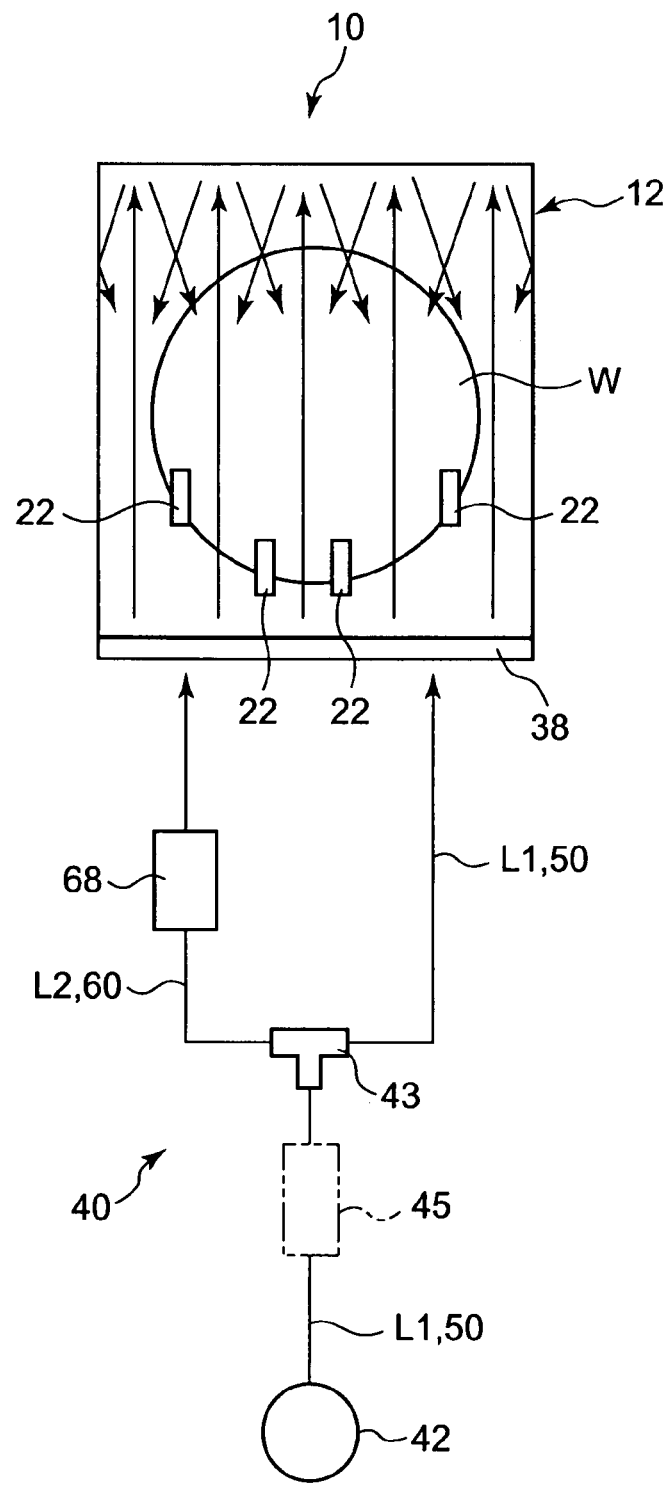
FIG. 5 is a view for explaining a mode of propagation of ultrasonic waves during a cleaning process.

FIG. 1 is a view showing a schematic structure of the substrate cleaning system. FIG. 2 is a cross-sectional view taken on the line II-II in FIG. 1. FIG. 3 is a diagram for explaining a change in dissolved gas concentrations of a cleaning liquid contained in a cleaning tank, and an operating mode of an ultrasonic generator, during a cleaning process. FIGS. 4 and 5 are views for explaining a mode of propagation of ultrasonic waves during a cleaning process.

Referring to FIG. 1, a substrate cleaning system 10 in this embodiment of the present invention includes: a cleaning tank (DIP tank) 12; a cleaning liquid supply system 40 connected to the cleaning tank 12 so as to supply a cleaning liquid into the cleaning tank 12; a holding member (also referred to as "wafer boat") 20 for holding wafers to be processed (substrates to be processed) W, an ultrasonic generator 30 for generating ultrasonic waves in the cleaning liquid contained in the cleaning tank 12; and a control device 18 connected to the cleaning liquid supply system 40 and the ultrasonic generator 30. The substrate cleaning system 10 immerses wafers to be processed W in the cleaning liquid contained in the cleaning tank 12 and generates ultrasonic waves in the cleaning liquid so as to clean the wafers to be processed W by ultrasonic cleaning.

The cleaning liquid supply system 40 is described in detail at first. As shown in FIG. 1, the cleaning liquid supply system 40 includes: a first channel L1 that supplies into the cleaning tank 12 a first cleaning liquid in which a gas, such as an air, preferably an inert gas, and more preferably nitrogen, is dissolved at a first dissolved gas concentration; and a second channel L2 branched from the first channel L1, the second channel L2 generating from the first cleaning liquid a second cleaning liquid having a second dissolved gas concentration, and supplying the thus generated second cleaning liquid into the cleaning tank 12. To be more specific, the cleaning liquid supply system 40 in this embodiment includes: a first supply pipe 50 constituting the first channel L1; a second supply pipe 60 constituting the second channel L2; and a cleaning liquid source 42 connected to the first supply pipe 50 so as to supply the first cleaning liquid having the gas dissolved therein at the first dissolved gas concentration. As shown in FIG. 1, at a portion between the first supply pipe 50 and the second supply pipe 60, there is connected a branching pipe 43 that allows a part of the first cleaning liquid flowing through the first supply pipe 50 to separately flow into the second supply pipe 60. In this embodiment, pure water (e.g., deionized water (DIW)) is supplied as a cleaning liquid from the cleaning liquid source 42.

As shown in FIG. 1, the cleaning liquid supply system 40 includes also a chemical supply unit 47 for supplying a chemical element into a deionized water flowing through the first supply pipe 50 and the second supply pipe 60. The chemical supply unit 47 includes: a first mixing valve 55 placed in the first supply pipe 50; a second mixing valve 65 placed in the second supply pipe 60; and a first chemical source 48 and a second chemical source 49 that are connected to the first mixing valve 55 and the second mixing valve 65 so as to supply chemical elements to the first and second mixing valves 55 and 65. In this embodiment, the first chemical source 48 supplies hydrogen peroxide as a first chemical element, and the second chemical source 49 supplies ammonia as a second chemical element. Thus, by supplying chemical elements from the first chemical source 48 and the second chemical source 49 into the respective supply pipes 50 and 60, a chemical solution, namely, an ammonia-hydrogen peroxide solution SC1 ($NH_4OH/H_2O_2/H_2O$) can be supplied into the supply tank 12.

As shown in FIG. 1, the first supply pipe 50 is provided with an on-off valve 54 for opening and closing the supply pipe 50, and a flowmeter 52 capable of adjusting a flow rate of the cleaning liquid flowing through the supply pipe 50. The second supply pipe 60 is provided with an on-off valve 64 for opening and closing the supply pipe 60, and a flowmeter 62 capable of adjusting a flow rate of the cleaning liquid flowing through the supply pipe 60. The flowmeters 52 and 62 are connected to the control device 18. Thus, a flow rate of the cleaning liquid flowing through the first supply pipe 50 and a flow rate of the cleaning liquid flowing through the second supply pipe 60 can be controlled by the control device 18 through the respective flowmeters 52 and 62.

As shown in FIGS. 1 and 2, two first cleaning nozzles 56, which extend along opposed wall surfaces of the cleaning tank 12, are connected to ends of the first supply pipe 50 on a side of the cleaning tank 12. Similarly, two second cleaning nozzles 66, which extend along the opposed wall surfaces of the cleaning tank 12, are connected to ends of the second supply pipe 60 on a side of the cleaning tank 12. Although FIG. 2 shows only the first cleaning nozzles 56, each second cleaning nozzle 66 has the same structure as that of the illustrated first cleaning nozzle 56.

The first cleaning nozzles 56 and the second cleanings nozzle 66 are elongated tubular members extending along the wall surfaces of the cleaning tank 12. The respective tubular members are provided with a number of nozzle holes 56a and 66a which are arranged at fixed longitudinal intervals. The positions of the nozzle holes 56a and 66a are dependent on the positions of the wafers to be processed W held by the holding member 20, which is described hereinbelow. As shown in FIG. 1, in this embodiment, the first cleaning nozzles 56 are arranged above the second cleaning nozzles 66. However, not limited to the above arrangement, the second cleaning nozzles 66 may be arranged above the first cleaning nozzles 56. Alternatively, it is possible to supply the first cleaning liquid and the second cleaning liquid through a single nozzle, after the first cleaning liquid and the second cleaning liquid are mixed with each other, which will be described hereinafter as a modification.

The cleaning liquid supply system 40 further includes a deaerator 68 placed in the second supply pipe 60. The deaerator 68 is adapted to deaerate (remove a gas from) the first cleaning liquid (pure water in this embodiment) flowing into the second supply pipe 60 (second channel L2) through the branching pipe 43 from the first supply pipe 50 (first channel L1) so as to generate the second cleaning liquid in which the gas is dissolved at a dissolved gas concentration lower than that of the first cleaning liquid.

The deaerator 68 may be any suitable one of known membrane deaerators and vacuum deaerators. The relation between the input to the deaerator 68 (for example, electric energy to be supplied) and the amount of gases corresponding to the input that can be removed from the cleaning liquid, namely, the reduction of the dissolved gas concentration corresponding to the input, is determined beforehand. An input to the deaerator 68 is determined according to a desired amount of gases to be removed on the basis of the thus determined relation and the determined input is supplied to the deaerator 68. Thus, the second cleaning liquid in which the gas is dissolved at a desired dissolved gas concentration can be obtained.

In this embodiment, a dissolved gas concentration of the second cleaning liquid is set at 0 ppm. In this case, an input which is slightly higher than the input determined based on the relation may be supplied to the deaerator. Then, a dissolved gas concentration of the second cleaning liquid can be set at the preselected dissolved gas concentration (0 ppm) in relatively a simple and stable manner.

Meanwhile, in this embodiment, a dissolved gas concentration of the first cleaning liquid is the saturated concentration. Such a first cleaning liquid is generally available as industrial water (water which is prepared in factories for use in various industrial productions). Thus, it is significantly advantageous in terms of costs to use, as the first cleaning liquid, a cleaning liquid having a saturated dissolved-gas concentration.

However, in the case that a dissolved gas concentration of the industrial water is unstable, it is preferable to dispose a dissolving device 45, which is depicted by two-dot chain lines in FIG. 1, in the first channel L1. The dissolving device 45 is connected to a gas source 46. Then, the first cleaning liquid whose dissolved gas concentration is the saturated concentration can be stably supplied from the first supply pipe 50. Similar to the deaerator 68, the dissolving device 45 may be any suitable one of various known dissolving devices. The relation between the input to the dissolving device 45 and the amount of gases corresponding to the input that can be dissolved in the cleaning liquid, namely, the increase of the dissolved gas concentration corresponding to the input, is determined beforehand. An input to the dissolving device 45 is determined according to a desired amount of gases to be dissolved on the basis of the thus determined relation and the determined input is supplied to the dissolving device 45. Thus, the first cleaning liquid in which the gas is dissolved at a desired dissolved gas concentration can be obtained. In particular, as in this embodiment, when the gas is dissolved by using the dissolving device 45 at the saturated concentration, an input which is slightly higher than the input determined based on the relation may be supplied to the dissolving device. Then, a dissolved gas concentration of the first cleaning liquid can be set at the preselected concentration (saturated concentration) in relatively a simple and stable manner.

A temperature of the first cleaning liquid or the second cleaning liquid to be supplied into the cleaning tank from the cleaning liquid supply system 40 is not specifically limited. For example, the temperature may be set at 25° C. In order to change the temperature of the cleaning liquid contained in the cleaning tank 12 during a cleaning process, the temperatures of the first cleaning liquid and the second cleaning liquid may be made variable.

Herein, the "saturated concentration" is judged by a value whose unit is "ppm" which is rounded off to whole number. The "0 ppm" means a dissolved gas concentration of 0 ppm obtained by rounding off the value to first decimal place, namely, a dissolved gas concentration of smaller than 0.5 ppm.

The cleaning tank 12 into which the first cleaning liquid and the second cleaning liquid are supplied by the cleaning liquid supply system 40 is described. As shown in FIGS. 1 and 2, the cleaning tank 12 has an a shape substantially resembling a rectangular solid. The cleaning tank 12 has an open upper end through which wafers W are carried into and carried out of the cleaning tank 12, which will be described hereinafter. A drain pipe 13 is connected to a bottom wall of the cleaning tank 12 so as to drain the cleaning liquid from the cleaning tank 12.

As shown in FIG. 1, an outer tank (recovery tank) 15 surrounds the open upper end of the cleaning tank 12. The cleaning liquid overflowing from the cleaning tank 12 through the open upper end is received in the outer tank 15.

Similar to the cleaning tank 12, a drain pipe 16 is connected to the outer tank 15 so as to drain the cleaning liquid from the outer tank 15.

The cleaning tank 12 and the outer tank 15 are made of a material having a high chemical resistance, such as quartz or the like. The cleaning liquid drained through the drain pipes 13 and 16 of the respective cleaning tanks 12 and the outer tank 15 may be discarded or reused.

The holding member 20 for holding wafers W is described. Referring to FIGS. 1 and 2, the holding member 20 has four support bars 22 extending substantially along a horizontal direction, and a base 24 holding the four support bars 22 in a cantilever fashion. A plurality of wafers W, which are to be cleaned at the same time, namely, a batch formed of, e.g., fifty wafers W is supported on the support bars 22 from below. The support bars 22 are provided with grooves, not shown, longitudinally arranged at fixed intervals. The surfaces of the wafers W engaged in the grooves of the support bars 22 are substantially perpendicular to a direction in which the support bars 22 are extended. That is to say, the wafers W are supported on the holding member 20 with the surfaces thereof extended vertically as shown in FIG. 1.

As obvious from FIG. 2, pitches of the nozzle holes 56a of the first cleaning nozzles 56 and pitches of the nozzle holes 66a of the second cleaning nozzles 66 are substantially equal to pitches of the wafers W supported on the holding member 20. The respective nozzle holes 56a and 66a of the first cleaning nozzles 56 and the second cleaning nozzles 66 are arranged so as to supply the cleaning liquid into spaces between the adjacent wafers W held by the holding member 20.

The base 24 of the holding member 20 is connected to a lifting mechanism, not shown. The lifting mechanism lowers the holding member 20 supporting the wafers W so as to immerse the wafers W in the cleaning liquid contained in the cleaning tank 12. The lifting mechanism is connected to the control device 18. Thus, the control device 18 controls the lifting mechanism so as to immerse the wafers W in the cleaning liquid.

The ultrasonic generator 30 is described. As shown in FIG. 1, the ultrasonic generator 30 includes: vibrating members 38 attached to the outer surface of the bottom wall of the cleaning tank 12; a high-frequency power source 32 for driving the vibrating members 38; and an ultrasonic oscillator 34 connected to the high-frequency power source 32. In this embodiment, each of the vibrating members 38 covers a part of the outer surface of the bottom wall of the cleaning tank 12. As shown in FIG. 1, the ultrasonic generator 30 further includes a driving mode selector 36 connected to the ultrasonic oscillator 34 and the vibrating members 38. The driving mode selector 36 selects a total driving mode in which all the vibrating members 38 are driven for ultrasonic wave generation, or a partial driving mode in which one or some of the vibrating members 38 are driven individually for ultrasonic wave generation.

The vibrating members 38 are driven for vibration. Then, ultrasonic waves are transmitted through the bottom wall of the cleaning tank 12 to the cleaning liquid contained therein. Thus, the ultrasonic waves are propagated in the cleaning liquid contained in the cleaning tank 12. The ultrasonic generator 30 is connected to the control device 18. Thus, the control device 18 controls the radiation (application) of the ultrasonic waves to the cleaning liquid.

The control device 18 is described. As mentioned above, the control device 18 is connected to the components of the substrate cleaning system 10 so as to control operations of these components. In this embodiment, the control device 18 includes a computer. The computer executes a program stored beforehand in a storage medium so as to accomplish a wafer cleaning method by the substrate cleaning system 10.

A wafer cleaning method to be carried out by the substrate cleaning system 10 as structured above will be described by way of example with reference to FIGS. 3 to 5.

At first, a pure water as a cleaning liquid is supplied from the cleaning liquid source 42 to the first supply pipe 50 (first channel L1). A dissolved gas concentration of the gas dissolved in the pure water is the saturated concentration. However, when the dissolved gas concentration of the cleaning liquid (pure water) is unstable, the dissolving device 45 dissolves a gas in the cleaning liquid in order that the dissolved gas concentration of the cleaning liquid reaches the saturated concentration. When the gas is dissolved, it is not necessary to strictly control a supply rate of the gas supplied from the gas source 46, since a target value of the dissolved gas concentration is the saturated concentration. Thus, the first cleaning liquid having a saturated dissolved-gas concentration can be easily obtained at a low cost.

A part of the first cleaning liquid of the saturated dissolved-gas concentration is made separately to flow into the second supply pipe 60 (second channel L2) through the branching pipe 43. The cleaning liquid whose dissolved gas concentration is the saturated concentration flowing through the second supply pipe 60 is deaerated by the deaerator 68 such that the dissolved gas concentration thereof becomes 0 ppm. When the cleaning liquid is deaerated, it is not necessary to strictly control the deaeration conditions, since a target value of the dissolved gas concentration is 0 ppm. Thus, the second cleaning liquid having a 0 ppm dissolved-gas concentration can be easily obtained at a low cost.

In this manner, the first cleaning liquid (pure water) having a saturated dissolved-gas concentration flows through the first supply pipe 50, and the second cleaning liquid (pure water) having a 0 ppm dissolved-gas concentration flows through the second pipe 60. The first cleaning liquid and the second cleaning liquid are then supplied into the cleaning tank 12. A supply rate of the first cleaning liquid and a supply rate of the second cleaning liquid are determined by the control device 18 that adjusts opening degrees of the respective flowmeters 52 and 62. Based on the preset program, the control device 18 determines a ratio between the supply rates of the first cleaning liquid and the second cleaning liquid, taking into consideration of the dissolved gas concentration (saturated concentration) of the first cleaning liquid and the dissolved gas concentration (0 ppm) of the second cleaning liquid. Thus, the dissolved gas concentration of the cleaning liquid to be supplied and stored in the cleaning tank 12 can be easily set at a predetermined concentration at a low cost. In this embodiment, as shown in FIG. 3, the dissolved gas concentration at this moment is controlled at a high dissolved-gas concentration of, e.g., about 14 ppm.

Meanwhile, hydrogen peroxide as a first chemical element is supplied from the first chemical source 48 of the chemical supply unit 47 into the first supply pipe 50 and the second supply pipe 60, and ammonia as a second chemical element is supplied from the second chemical source 49 into the first supply pipe 50 and the second supply pipe 60. As a result, both the first cleaning liquid and the second cleaning liquid are supplied into the cleaning tank 12 as the chemical solution SC1. Supply rates of the chemical elements supplied from the respective chemical sources 48 and 49 to the respective supply pipes 50 and 60 are controlled by the control device 18 based on the flow rates of the cleaning liquids (pure water) flowing through the supply pipes 50 and 60.

In this manner, after the time point A shown in FIG. 3, the cleaning liquid (SC1) in which a gas is dissolved at a high dissolved gas concentration (e.g., 14 ppm) is stored in the cleaning tank 12.

Then, the holding member 20 holding the predetermined number of (e.g., fifty) wafers to be processed W is lowered so that the wafers to be processed W are immersed in the cleaning liquid contained in the cleaning tank 12.

Thereafter, the control device 18 actuates the ultrasonic generator 30 so as to generate ultrasonic waves in the cleaning liquid contained in the cleaning tank 12. Thus, the wafers W immersed in the cleaning liquid contained in the cleaning tank 12 are subjected to an ultrasonic cleaning process (megasonic process), so that particles (foreign matters) adhering to the surfaces of the wafers W are removed.

In this embodiment, throughout this step, the first cleaning liquid (chemical liquid) continues to be supplied from the first supply pipe 50 into the cleaning tank 12, and the second cleaning liquid (chemical liquid) continues to be supplied from the second supply pipe 60 into the cleaning tank 12. As shown in FIGS. 1 and 2, the first cleaning liquid is jetted diagonally upward toward a space between the adjacent two wafers held by the holding member 20. Similarly, the second cleaning liquid is jetted diagonally upward toward a space between the adjacent two wafers W held by the holding member 20. The diagonally upward flow of the first cleaning liquid and the second cleaning liquid facilitates that the particles removed from the wafers W are carried upward to the surface of the cleaning liquid contained in the cleaning tank 12 so as to overflow from the cleaning tank 12 into the outer tank 15 with the cleaning liquid. Thus, the particles removed from the wafers W can be prevented from adhering again to the wafers W. However, it is not necessary to keep the supply of the cleaning liquids into the cleaning tank 12 during this step. It is possible to limit a supply period of the cleaning liquids. Alternatively, it is possible not to supply the cleaning liquids.

The above-described first ultrasonic cleaning step in which ultrasonic waves are generated in the cleaning liquid of a higher dissolved gas concentration (for example, 14 ppm) continues for 5 minutes, for example, which is the term between the time point A and the time point B shown in FIG. 3.

Subsequently, the ultrasonic generator 30 stops the radiation of ultrasonic waves, and the dissolved gas concentration of the cleaning liquid contained in the cleaning tank 12 is changed. In this embodiment, the dissolved gas concentration is lowered from the higher dissolved gas concentration (e.g., 14 ppm) to, e.g., 12 ppm (hereafter, this lowered dissolved gas concentration is also referred to as "lower dissolved gas concentration" which is lower than the higher dissolved gas concentration (for example, 14 ppm) in the first ultrasonic cleaning step). The dissolved gas concentration of the cleaning liquid contained in the cleaning tank 12 may be changed by supplying from the second supply pipe 60 a predetermined amount of the second cleaning liquid (chemical solution) whose dissolved gas concentration is 0 ppm. However, not limited to this method, the dissolved gas concentration may be lowered by, for example, supplying a large amount of the second cleaning liquid from the second supply pipe 60, and also by supplying a small amount of the first cleaning liquid from the first supply pipe 50.

Thus, after the time point C shown in FIG. 3, the dissolved gas concentration of the cleaning liquid contained in the cleaning tank 12 becomes the lower dissolved gas concentration (e.g., 12 ppm).

In the succeeding step, the control device 18 again actuates the ultrasonic generator 30 so as to generate ultrasonic waves in the cleaning liquid contained in the cleaning tank 12, the dissolved gas concentration of the cleaning liquid having been changed. This second ultrasonic cleaning step in which ultrasonic waves are generated in the cleaning liquid of the lower dissolved gas concentration (e.g., 12 ppm) continues for five minutes, for example, which is the term between the time point C and the time point D shown in FIG. 3. In this embodiment, throughout this step, the first cleaning liquid (chemical solution) continues to be supplied from the first supply pipe 50 into the cleaning tank 12, and the second cleaning liquid (chemical solution) continues to be supplied from the second supply pipe 60 into the cleaning tank 12. However, it is not necessary to keep the supply of the cleaning liquids into the cleaning tank 12 during this step. It is possible to limit a supply period of the cleaning liquids. Alternatively, it is possible not to supply the cleaning liquids.

In summary, the substrate cleaning method in this embodiment includes the first ultrasonic cleaning step in which ultrasonic waves are generated in the cleaning liquid having the higher dissolved gas concentration (for example, 14 ppm), and the second ultrasonic cleaning step in which ultrasonic waves are generated in the cleaning liquid having the lower dissolved gas concentration (for example, 12 ppm). As obvious from the examples hereinbelow, when the dissolved gas concentration of the cleaning liquid contained in the cleaning tank 12 is changed, not only a particle removal efficiency is varied in the wafer W as a whole, but also a position of an area where particles are easily removed moves in the wafer W. In other words, according to this embodiment, it is possible to clean, in the second ultrasonic cleaning step, a portion of the wafer from which particles are difficult to be removed in the first ultrasonic cleaning step.

Although a mechanism of this phenomenon is not clearly known, a mechanism that can be one of the factors will be described with reference to FIGS. 4 and 5. However, the present invention is not limited to the mechanism described below.

In ultrasonic cleaning, ultrasonic waves propagated in the cleaning liquid generate pressure vibrations in the cleaning liquid. Gas molecules contained in the cleaning liquid are ruptured by the pressure vibrations. The rupture of the gas molecules generates shock waves (cavitation). It is inferred that the generation of the shock waves (cavitation) is one of major factors that peels (removes) particles from the wafers W. Thus, it is expected that the higher the dissolved gas concentration of the cleaning liquid, the higher the intensity of the shock waves generated in regions in which ultrasonic waves are propagated and that the shock waves of a high intensity can remove particles from the wafers W at a high removing efficiency. On the other hand, as mentioned in JP10-109072A, it is thought that, when the dissolved gas concentration of the cleaning liquid is high, the gas dissolved in the cleaning liquid absorbs the ultrasonic waves, which may interfere with pervasion of the ultrasonic waves throughout the cleaning tank 12.

In view of the above, it is expected that, as shown in FIG. 4, when the dissolved gas concentration of the cleaning liquid is high, particles on a lower region of the wafer W can be removed at a high removing efficiency while ultrasonic waves are being radiated from below the wafer W. It is also expected that, a particle removing efficiency is degraded in regions of the wafer positioned above the bar members 22 which interfere with the ultrasonic waves radiated from below. Thus, when the dissolved gas concentration of the cleaning liquid is high, it is assumed that particles on the wafer W can be removed at relatively a high removing efficiency from the overall point of view, although the particle removing efficiency varies depending on regions of the wafer W. This assumption is compatible with the below-described results of the examples.

On the other hand, when the dissolved gas concentration of the cleaning liquid is low, as shown in FIG. 5, it is expected that ultrasonic waves are propagated up to the surface of the cleaning liquid, and then reflected by the surface so as to be diffused in the cleaning tank 12. Thus, it is assumed that particles on the wafer W can be removed relatively uniformly from the entire surface of the wafer W, although the particle removing efficiency is slightly low from the overall point of view. This assumption is compatible with the below-described results of the examples.

In short, according to this embodiment, since the first ultrasonic cleaning step using the cleaning liquid having the higher dissolved gas concentration is carried out at first, and then the second ultrasonic cleaning step using the cleaning liquid having the lower dissolved gas concentration is carried out, particles can be relatively uniformly removed from the entire surface of the wafer W at relatively a high removing efficiency.

At the time point C shown in FIG. 3, the ultrasonic generator 30 stops the radiation of the ultrasonic waves, and the second ultrasonic cleaning step is completed in which ultrasonic waves are generated in the cleaning liquid having the lower dissolved gas concentration (e.g., 12 ppm).

After completion of the second ultrasonic cleaning step, there succeeds a rinsing step for rinsing off the chemical solution as a cleaning liquid from the wafer. Specifically, the cleaning liquid (chemical solution) in the cleaning tank 12 and the cleaning liquid (chemical solution) in the outer tank 15 are drained through the respective drain pipes 13 and 16. As described above, the drained cleaning liquid may be discarded or collected for reuse. Then, the first cleaning liquid and the second cleaning liquid are supplied from the first supply pipe 50 and the second supply pipe 60, respectively. Note that, in this step, no chemical element is supplied from the first chemical source 48 and the second chemical source 49 of the chemical supply unit 47 into the first supply pipe 50 and the second supply pipe 60. Thus, the first cleaning liquid and the second cleaning liquid supplied into the cleaning tank 12 are pure water.

In this step, after the cleaning tank 12 is filled with the cleaning liquid (pure water) as described above, the cleaning liquid (pure water) is still supplied from the supply pipes 50 and 60. The cleaning liquid (pure water) overflows from the open upper end of the cleaning tank 12, and the cleaning liquid (pure water) that overflowed is received in the outer tank 15. The rinsing step of the wafers W is thus performed. The cleaning liquid (pure water) collected in the outer tank 15 may be discarded or reused.

When the rinsing step of the wafers W is finished, the holding member 20 moves upward so as to unload the wafers from the cleaning tank 12. Thus, a series of cleaning steps for cleaning the wafers W to be processed is completed.

In the above-described embodiment, the first ultrasonic cleaning step using the cleaning liquid having the higher dissolved gas concentration is performed at first, and then the second ultrasonic cleaning step using the cleaning liquid having the lower dissolved gas concentration is performed. In other words, the wafers W are subjected to the ultrasonic cleaning process in the cleaning liquids of different dissolved gas concentrations. The different dissolved gas concentrations of the cleaning liquids result in different propagation modes of ultrasonic waves in the cleaning liquids. Thus, it is possible to more uniformly radiate ultrasonic waves onto the entire surfaces of the wafers W, so that particles can be more uniformly removed from the wafers W. Further, the particle removing efficiency in the wafer W can be enhanced on the whole. In addition, in this cleaning method, it is not necessary to strictly maintain the dissolved gas concentration of the gas dissolved in the cleaning liquid during the cleaning process. Therefore, a cost required for the system can be reduced, which leads to a reduction in costs required for cleaning the wafers W.

According to this embodiment, the dissolved gas concentration of the cleaning liquid contained in the cleaning tank 12 is varied by supplying at least one of the first cleaning liquid of a saturated dissolved-gas concentration and the second cleaning liquid of a 0 ppm dissolved-gas concentration. Thus, with a simple control of the flow rate of the first cleaning liquid and the flow rate of the second cleaning liquid, which are supplied into the cleaning tank 12, not only the dissolved gas concentration of the cleaning liquid contained in the cleaning liquid 12 can be varied, but also the dissolved gas concentration of the cleaning liquid contained in the cleaning tank 12 can be adjusted at a desired concentration. Further, the first cleaning liquid whose dissolved gas concentration is the saturated concentration, and the second cleaning liquid whose dissolved gas concentration is 0 ppm can be relatively easily generated at a lower cost by a simple system and a simple control. Therefore, the dissolved gas concentration of the cleaning liquid contained in the cleaning tank 12 can be significantly easily changed. Furthermore, the dissolved gas concentration of the cleaning liquid contained in the cleaning tank 12 can be significantly easily set at a given dissolved gas concentration.

The above embodiment can be modified in various ways within the scope of the present invention. Modifications of the present invention will be described below by way of example.

In the foregoing embodiment, a pure water whose dissolved gas concentration is the saturated concentration is obtained from industrial water, and is generated by dissolving a gas in industrial water by means of the dissolving device 45. However, the present invention is not limited thereto. For example, when a cleaning liquid in which only an inert gas such as nitrogen has been dissolved is required, namely, when it is desired that a gas other than nitrogen, for example, oxygen has been previously removed from the cleaning liquid, as shown in FIG. 1, a deaerator 45a may be further disposed on an upstream side of the dissolving device 45. In this example, the deaerator 45a deaerates (removes a gas from) the cleaning liquid supplied from the cleaning liquid source 42 such that the dissolved gas concentration thereof becomes 0 ppm. Thereafter, the dissolving device 45 dissolves nitrogen, for example, in the cleaning liquid such that the dissolved gas concentration thereof becomes the saturated concentration. The deaerator 45a may be one of known deaerators.

In the foregoing embodiment, the ultrasonic cleaning with the cleaning liquid of the higher dissolved gas concentration is performed at first, then the dissolved gas concentration of the cleaning liquid contained in the cleaning tank 12 is lowered, and thereafter the ultrasonic cleaning with the cleaning liquid of the lower dissolved gas concentration is performed. However, the present invention is not limited thereto. As a modification, it is possible that the ultrasonic cleaning with the cleaning liquid of the lower dissolved gas concentration is performed at first, then the dissolved gas concentration of the cleaning liquid contained in the cleaning tank 12 is increased, and thereafter the ultrasonic cleaning with the cleaning liquid of the higher dissolved gas concentration is performed. That is to say, the order of the first ultrasonic cleaning step and the second ultrasonic cleaning step in the above-described embodiment may be reversed.

In the foregoing embodiment, the wafers W are subjected to the ultrasonic cleaning process in twice, using two kinds of cleaning liquids having different dissolved gas concentrations. However, the present invention is not limited thereto. For example, the wafers W may be subjected to the ultrasonic cleaning process in three or more times, using three or more kinds of cleaning liquids having different dissolved gas concentrations.

Figure 6:
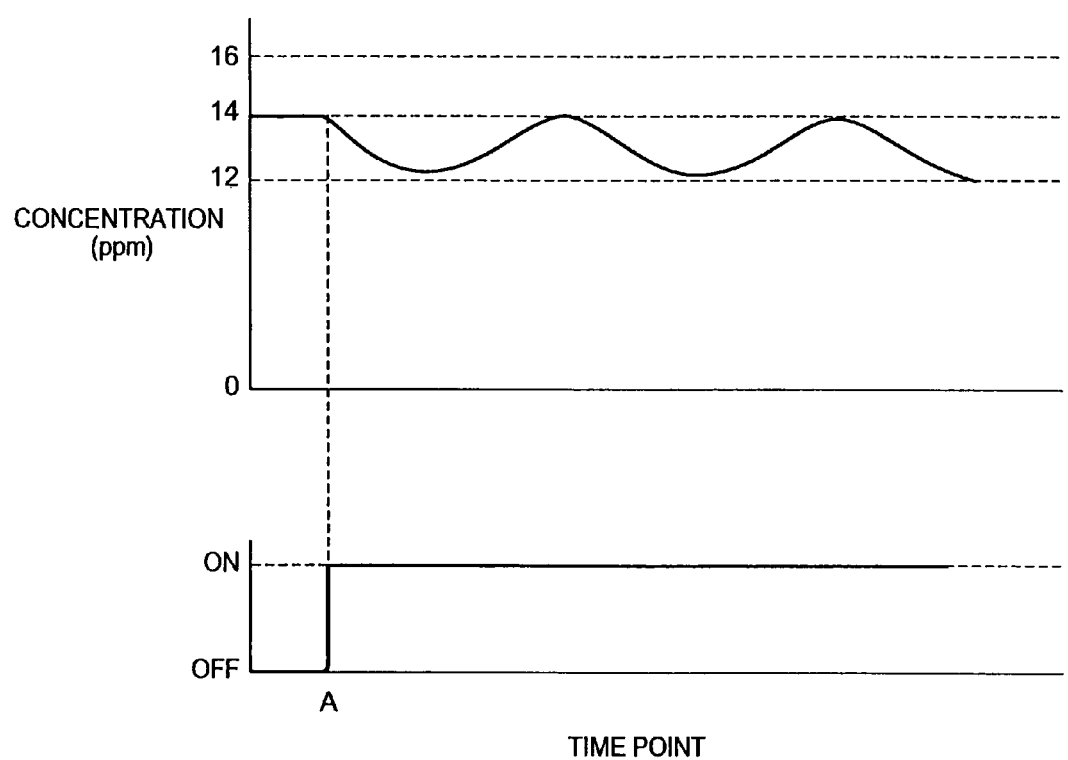
FIG. 6 is a diagram corresponding to FIG. 3, for explaining an alternative example of a change in dissolved gas concentrations of a cleaning liquid in a cleaning tank, and an operating mode of an ultrasonic generator, during a cleaning process.

In the foregoing embodiment, the radiation of ultrasonic waves by the ultrasonic generator 30 is stopped for a while, and the dissolved gas concentration of the cleaning liquid contained in the cleaning tank 12 is changed during this intermission. However, the present invention is not limited thereto. For example, it is possible to vary the dissolved gas concentration of the cleaning liquid contained in the cleaning tank 12, while ultrasonic waves are being generated in the cleaning liquid contained in the cleaning tank 12 by the ultrasonic generator 30. FIG. 6 shows such an example in which the dissolved gas concentration of the cleaning liquid is changed while ultrasonic waves are being generated in the cleaning liquid. In this example shown in FIG. 6, the dissolved gas concentration of the cleaning liquid is repeatedly increased and decreased, while the ultrasonic generator 30 generates ultrasonic waves in the cleaning liquid. The dissolved gas concentration can be changed by, for example, alternately supplying the second cleaning liquid from the second supply pipe 60 into the cleaning tank 12 and the first cleaning liquid from the first supply pipe 50 into the cleaning tank 12.

In the foregoing embodiment, SC1 is used as a cleaning liquid for the ultrasonic cleaning of the wafers W. However, not limited thereto, the wafers W may be cleaned by the ultrasonic cleaning process using a chemical solution other than SC1. For example, the cleaning liquid may be pure water (e.g., deionized water). When the wafers W are cleaned by the ultrasonic cleaning process using pure water as a cleaning liquid, the rinsing process can be omitted.

In the foregoing embodiment, the ultrasonic generator 30 is stopped so as not to generate ultrasonic waves in the pure water (cleaning liquid) during the rising process for rinsing off the chemical solution (cleaning liquid) with a pure water (cleaning liquid). However, not limited thereto, it is possible to generate ultrasonic waves in the cleaning liquid (pure water) contained in the cleaning tank 12 by means of the ultrasonic generator 30 during the rinsing process for rinsing off the chemical solution (cleaning liquid), so that a rinsing effect of the rinsing process can be enhanced and particles (foreign matters) still remaining on the wafer W can be further removed. In this case, by varying the dissolved gas concentration of the cleaning liquid in which ultrasonic waves are generated, it is possible to rinse relatively uniformly the entire surfaces of the wafers W at relatively a high rinsing efficiency, and to remove relatively uniformly particles from the entire surfaces of the wafer W at relatively a high removing efficiency.

In the foregoing embodiment, the cleaning liquid supply system 40 includes: the first supply pipe 50 connected to the cleaning tank 12 so as to supply the first cleaning liquid into the cleaning tank 12; the second supply pipe 60 connected to the cleaning tank 12 separately from the first supply pipe 50 so as to supply into the cleaning tank 12 the second cleaning liquid whose dissolved gas concentration is different from that of the first cleaning liquid; the deaerator 68 placed in the second supply pipe 60; the branching pipe 43 connected to the first supply pipe 50 and the second supply pipe 60 so as to allow a part of the first cleaning liquid flowing through the first supply pipe 50 to separately flow into the second supply pipe 60. However, not limited thereto, the cleaning liquid supply system 40 may further include a mix and supply pipe 71 connected to the first supply pipe 50 and the second supply pipe 60, so that the first cleaning liquid and the second cleaning liquid can be mixed with each other and supplied into the cleaning tank 12. Alternatively, there may be disposed a single channel through which the cleaning liquid flows from the cleaning liquid source 42 to the cleaning tank 12. In this case, at least one of the deaerator 68 and the dissolving device 72 is placed in the channel, so that the cleaning liquids having different dissolved gas concentrations can be supplied into the cleaning tank 12. Further, in place of generating the second cleaning liquid having the lower dissolved gas concentration by deaerating the first cleaning liquid having the higher dissolved gas concentration, the first cleaning liquid having the higher dissolved gas concentration may be generated from the second cleaning liquid having the lower dissolved gas concentration by dissolving the gas in the second cleaning liquid.

Herebelow, five concrete modifications of the cleaning liquid supply system 40 are described with reference to FIGS. 7 to 11. Note that these modifications of the cleaning liquid supply system 40 are described only by way of example, and the present invention is not limited to these modifications. In FIGS. 7 to 11, the same parts as those described in the above embodiment, and the same parts in the modifications shown in FIGS. 7 to 11 are represented by the same reference numbers, and the overlapping detailed description is omitted. Each of FIGS. 7 to 11 is a view showing a schematic structure of the cleaning liquid supply system 40, and corresponds to FIGS. 4 and 5. Some constituent elements of those in the substrate cleaning system shown in FIG. 1 are omitted in FIGS. 4 and 5. These constituent elements are also omitted in FIGS. 7 to 11.

Figure 7:
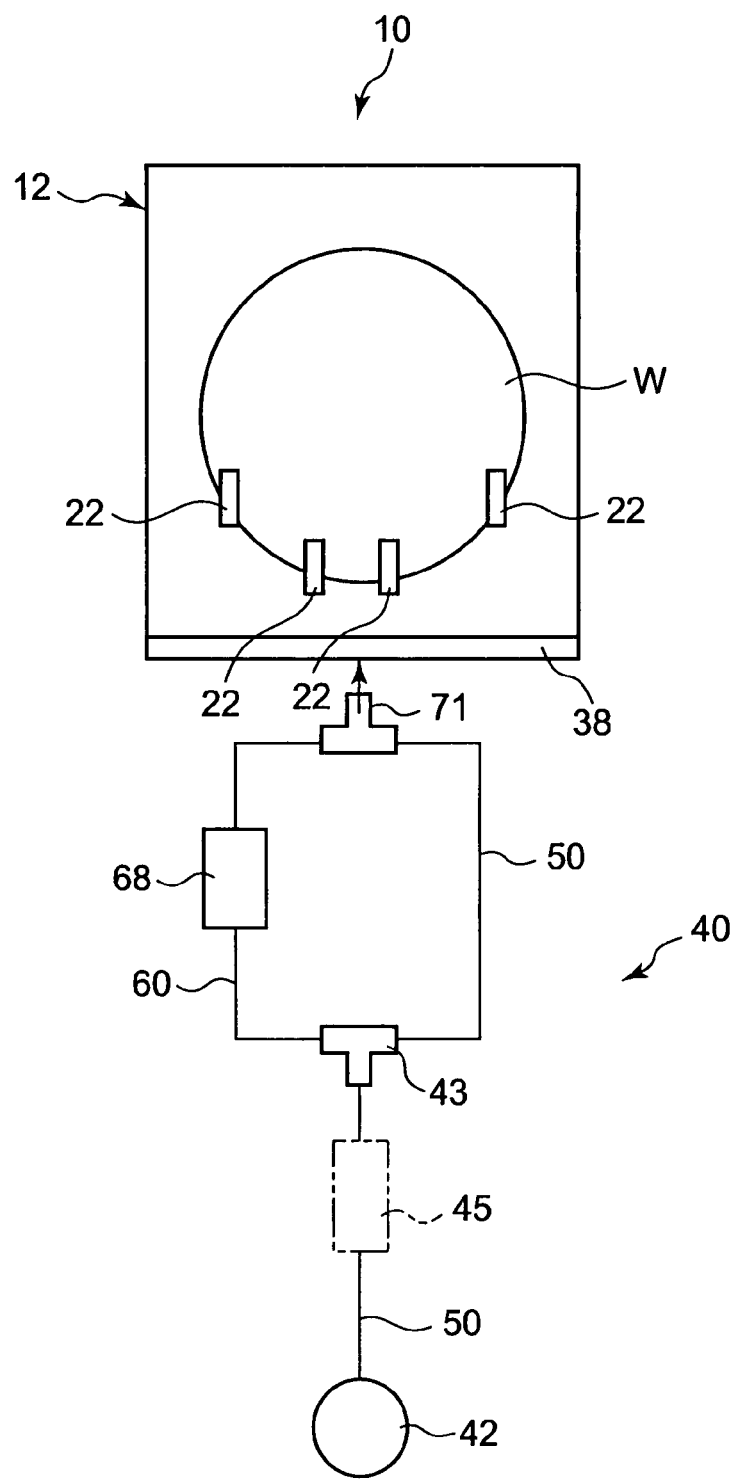
FIG. 7 is a view showing a schematic structure of Modification 1 of a cleaning liquid supply system of the substrate cleaning system.

Referring to FIG. 7, Modification 1 of the cleaning liquid supply system is described. A cleaning liquid supply system 40 shown in FIG. 7 includes: a first supply pipe 50 that supplies a first cleaning liquid; a second supply pipe 60 that supplies a second cleaning liquid having a dissolved gas concentration different from that of the first cleaning liquid; a deaerator 68 placed in the second supply pipe 60; a branching pipe 43 connected to the first supply pipe 50 and the second supply pipe 60 so as to allow a part of the first cleaning liquid flowing through the first cleaning pipe 50 to separately flow into the second cleaning pipe 60; and a mixing supply tube 71 that is capable of mixing the first cleaning liquid and the second cleaning liquid with each other and supplying the same into the cleaning tank 12. That is to say, the cleaning liquid supply system 40 in this modification is made by adding the mixing supply tube 71 to the cleaning liquid supply system 40 in the foregoing embodiment.

Figure 8:
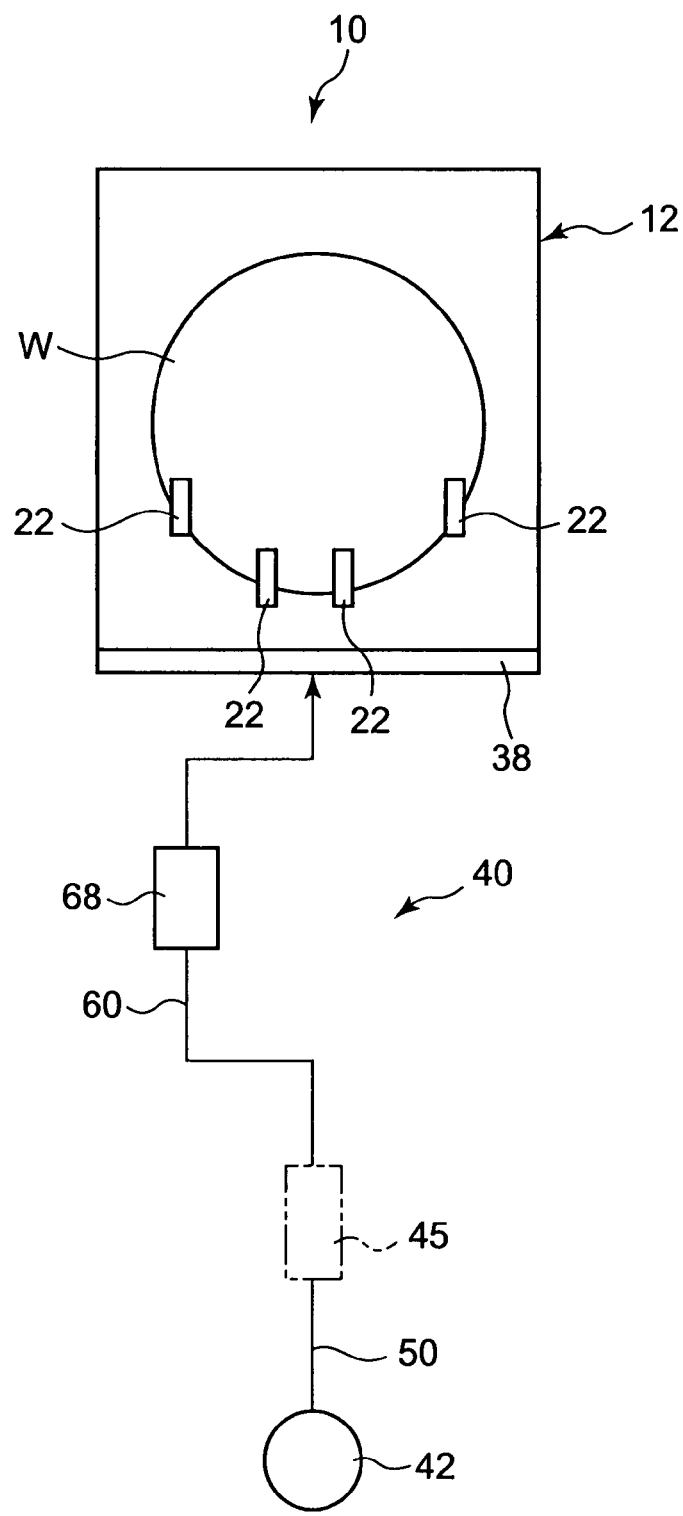
FIG. 8 is a view showing a schematic structure of Modification 2 of a cleaning liquid supply system of the substrate cleaning system.

Next, referring to FIG. 8, Modification 2 of the cleaning liquid supply system is described. A cleaning liquid supply system 40 shown in FIG. 8 includes: a supply pipe 60 connected to a cleaning tank 12 into which supply pipe 60 a cleaning liquid directed toward the cleaning tank 12 is introduced; and a deaerator 68 placed in the supply pipe 60 so as to deaerate the cleaning liquid passing through the supply pipe 60. That is to say, the cleaning liquid supply system 40 in this modification is made by eliminating a part of the first supply pipe 50 on a downstream side of the branching pipe 43 of the cleaning liquid supply system 40 in the foregoing embodiment. By activating the deaerator 68 and by stopping the activation thereof, cleaning liquids of different dissolved gas concentrations can be supplied into the cleaning tank 12 through the single supply pipe 60. However, in this modification, it is not necessary to maintain an input to the deaerator 68 to be constant. Namely, it is possible not only that the deaerator 68 is activated at a certain input so as to decrease the dissolved gas concentration to a predetermined one, but also that the input to the deaerator 68 is changed so as to adjust the dissolved gas concentration at a desired one suitable for conditions.

Figure 9:
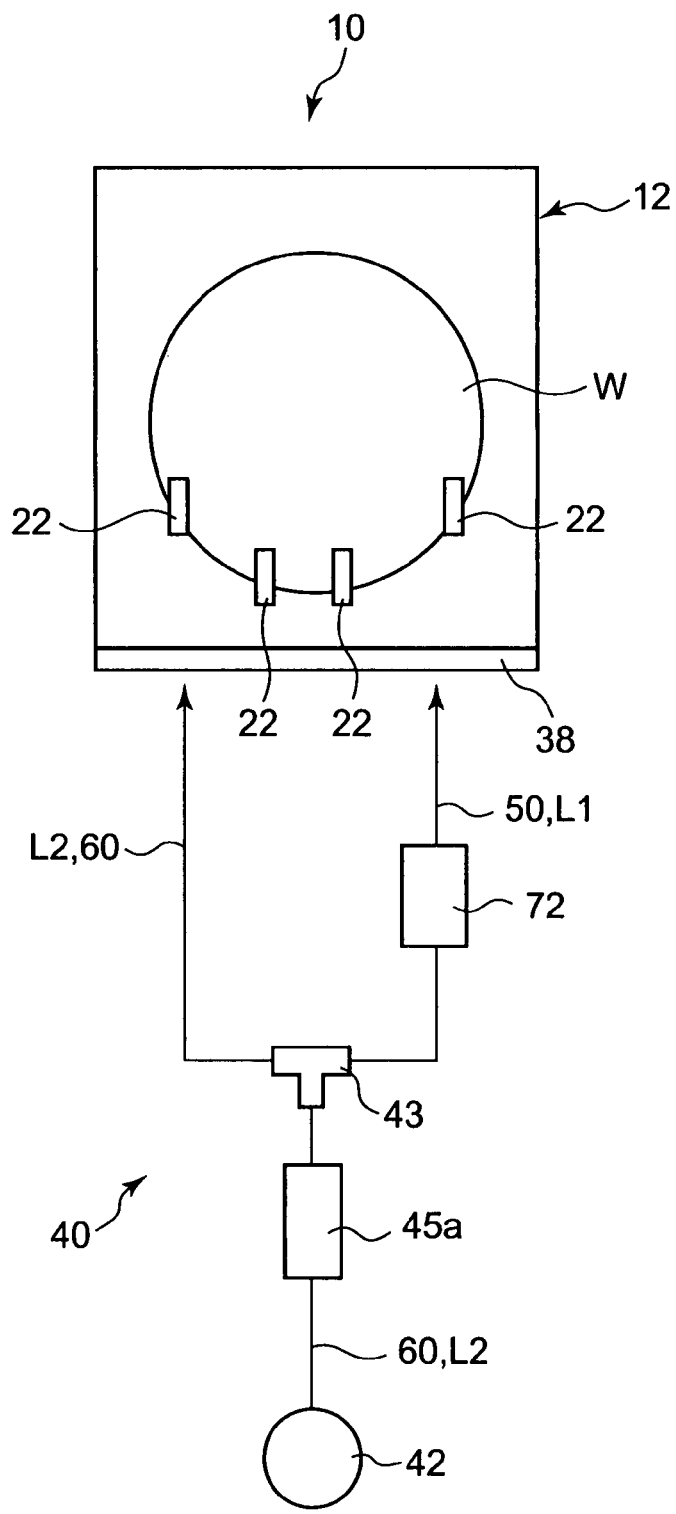
FIG. 9 is a view showing a schematic structure of Modification 3 of a cleaning liquid supply system of the substrate cleaning system.

Next, referring to FIG. 9, Modification 3 of the cleaning liquid supply system is described. A cleaning liquid supply system 40 shown in FIG. 9 includes: a first supply pipe 50 that supplies a first cleaning liquid into a cleaning tank 12; a second supply pipe 60 that supplies into the cleaning tank 12 a second cleaning liquid having a dissolved gas concentration different from that of the first cleaning liquid; a dissolving device 72 placed in the supply pipe 50; a branching pipe 43 connected to the first supply pipe 50 and the second supply pipe 60 so as to allow a part of the second cleaning liquid flowing through the second supply pipe 60 to separately flow into the first supply pipe 50; and a deaerator 45a placed in the second supply pipe 60 at a position upstream of the branching pipe 43.

That is to say, in the cleaning liquid supply system 40 in this modification, a cleaning liquid source 42 is connected to the second supply pipe 60, whereas the cleaning liquid source 42 is connected to the first supply pipe 50 in the cleaning supply system 40 in the foregoing embodiment. In this modification, a cleaning liquid supplied from the cleaning liquid source 42 is deaerated by the deaerator 45a, and then a part of the deaerated cleaning liquid is made separately to flow into the first supply pipe 50 through the branching pipe 43. In addition, the deaerator 68 placed in the second supply pipe 60 is omitted, and the dissolving device 72 is placed in the first supply pipe 50.

Figure 10:
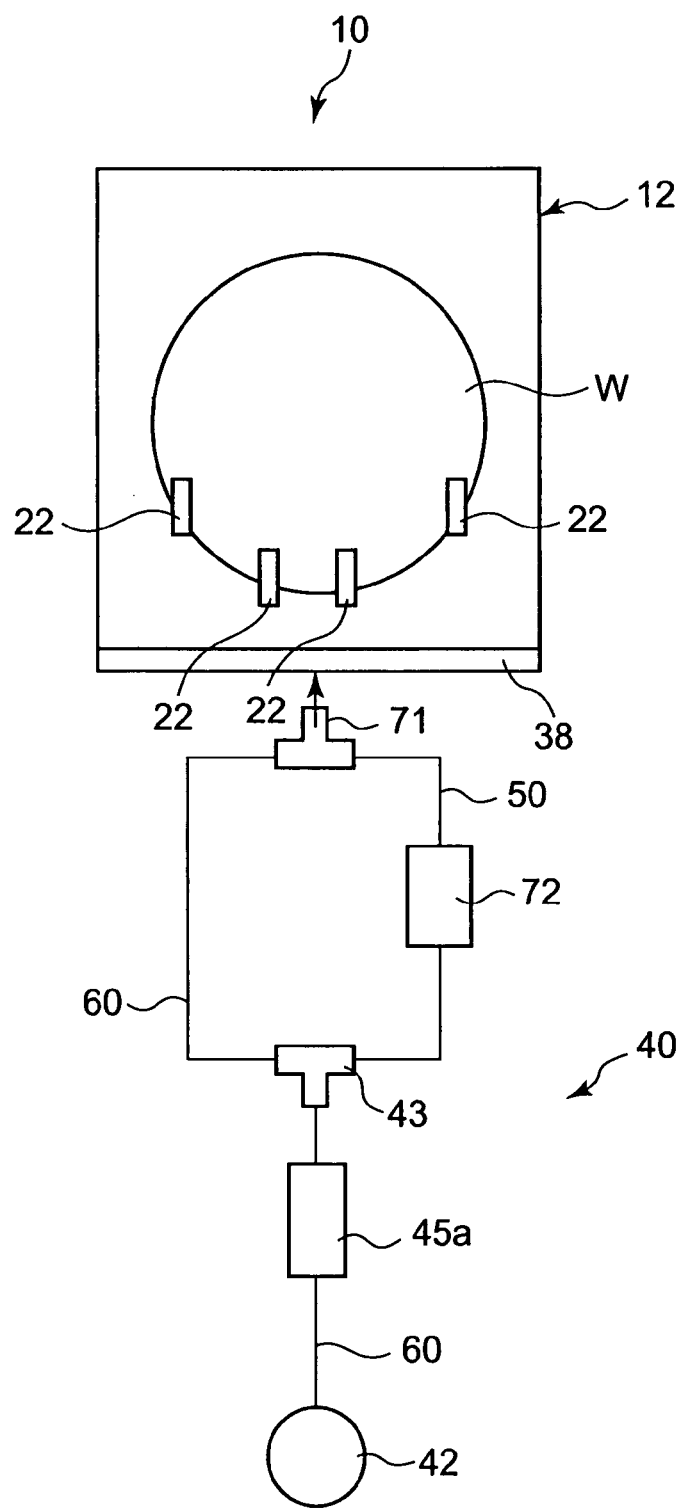
FIG. 10 is a view showing a schematic structure of Modification 4 of a cleaning liquid supply system of the substrate cleaning system.

Referring FIG. 10, Modification 4 of the cleaning liquid supply system is described. A cleaning liquid supply system 40 shown in FIG. 10 includes: a first supply pipe 50 that supplies a first cleaning liquid; a second supply pipe 60 that supplies a second cleaning liquid having a dissolved gas concentration different from that of the first cleaning liquid; a dissolving device 72 placed in the first supply pipe 50; a branching pipe 43 connected to the first supply pipe 50 and the second supply pipe 60 so as to allow a part of the second cleaning liquid flowing through the second supply pipe 60 to separately flow into the first supply pipe 50; a deaerator 45a placed in the second supply pipe 60 at a position upstream of the branching pipe 43; and a mix and supply pipe 71 that is capable of mixing the first cleaning liquid and the second cleaning liquid with each other and supplying the same into a cleaning tank 12.

That is to say, in the cleaning liquid in this modification, a cleaning liquid source 42 is connected to the second supply pipe 60, whereas the cleaning liquid source 42 is connected to the first supply pipe 50 in the cleaning supply system 40 in Modification 1 shown in FIG. 7. In this modification, a cleaning liquid supplied from the cleaning liquid source 42 is deaerated by the deaerator 45a, and then a part of the deaerated cleaning liquid is made separately to flow into the first supply pipe 50 through the branching pipe 43. Further, the deaerator 68 placed in the second supply pipe 60 is omitted, and the dissolving device 72 is placed in the first supply pipe 50. Furthermore, the cleaning liquid supply system 40 in this modification is made by adding the mix and supply pipe 71 to the cleaning liquid supply system 40 in Modification 3 shown in FIG. 9.

Figure 11:
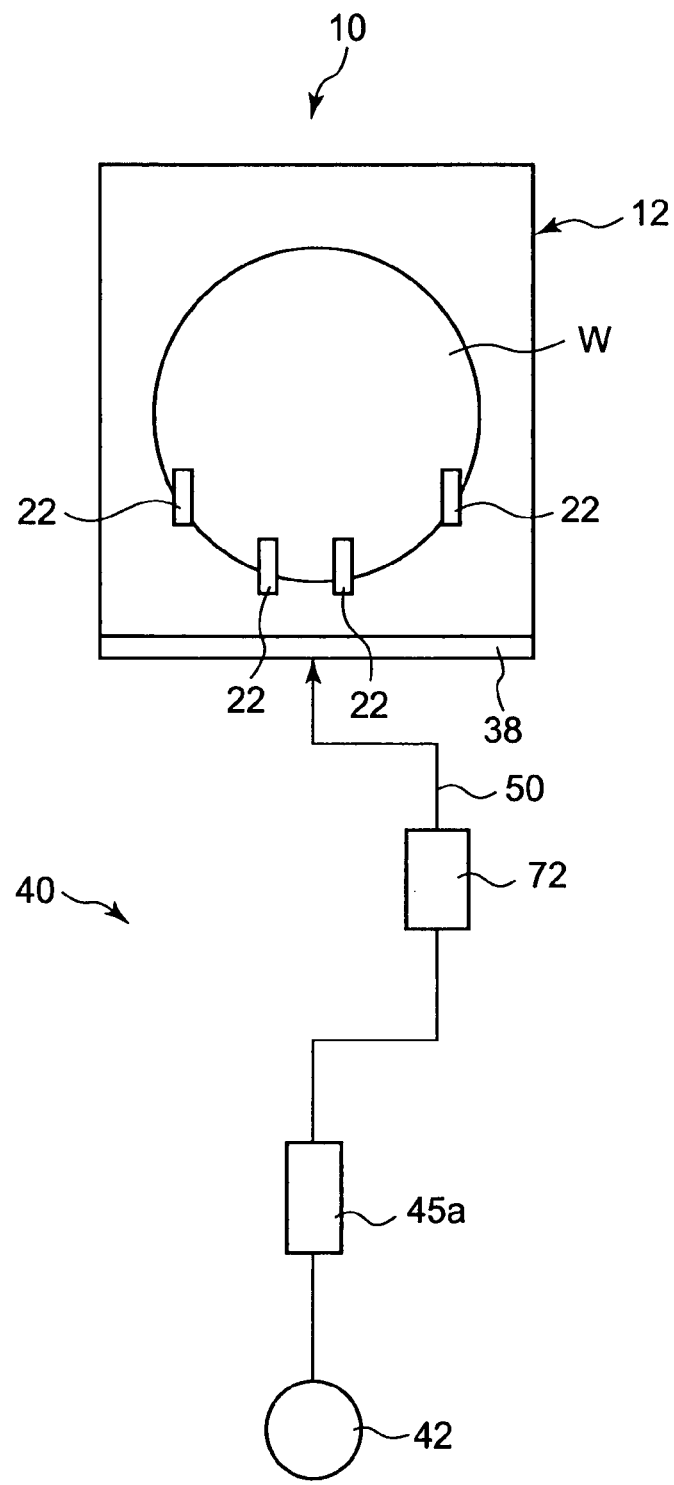
FIG. 11 is a view showing a schematic structure of Modification 5 of a cleaning liquid supply system of the substrate cleaning system.

Referring to FIG. 11, Modification 5 of the cleaning liquid supply system is described. A cleaning liquid supply system 40 shown in FIG. 11 includes: a supply pipe 50 connected to a cleaning tank 12 into which supply pipe 50 a cleaning liquid directed toward the cleaning tank 12 is introduced, and a dissolving device 72 placed in the supply pipe 50 so as to dissolve a gas in the cleaning liquid passing through the supply pipe 50.

That is to say, in the cleaning liquid supply system 40 in this modification, the deaerator 68, which is placed in the supply pipe of the cleaning liquid supply system 40 in an embodiment of Modification 2 shown in FIG. 8, is omitted, and the dissolving device 72 is placed in the supply pipe. By activating the dissolving device 72 and by stopping the activation thereof, the cleaning liquids of different dissolved gas concentrations can be supplied into the cleaning tank 12 through the single supply pipe. In addition, the cleaning liquid supply system 40 in this modification is made by eliminating a part of the second supply pipe 60 on a downstream side of the branching pipe 43 of the cleaning liquid supply system 40 in Modification 3 shown in FIG. 9.

In the foregoing embodiment, a dissolved gas concentration of the first cleaning liquid supplied from the first supply pipe 50 is the saturated concentration, and a dissolved gas concentration of the second cleaning liquid supplied from the second supply pipe 60 is 0 ppm. However, not limited thereto, the dissolved gas concentrations of the respective cleaning liquids may be set at various values.

Some possible modifications have been described with respect to the above embodiment. Naturally, these modifications can be suitably combined with each other.

The substrate cleaning system 10 has the control device 18 including the computer. The control device 18 controls operations of the components of the substrate cleaning system 10 so as to clean the wafer to be processed W. The present invention provides a program to be executed by the computer of the control device 18 so as to accomplish the wafer cleaning process, and a computer-readable storage medium 19 storing this program. The storage medium 19 may include a flexible disk, a hard disk, or the like.

Although the substrate cleaning methods, the substrate cleaning systems, the program, and the storage medium according to the present invention have been described as applied to cleaning the wafer W, the present invention is not limited thereto. For example, the present invention is applicable to cleaning LCD substrates, CD substrates, and the like.

EXAMPLES

In order to provide a more detailed explanation of the present invention in terms of the examples, two experiments were conducted.

Experiment 1

Cleaning liquids in which nitrogen had been dissolved at different dissolved gas concentrations were prepared, and cleaning tanks were filled with these cleaning liquids. Test wafers were immersed in the cleaning liquids and ultrasonic waves were generated in the cleaning liquids. The cleaning liquids used in this experiment had been deaerated such that their dissolved gas concentrations became 0 ppm, and then nitrogen was dissolved in the thus deaerated cleaning liquids at different dissolved gas concentrations. Namely, only nitrogen was dissolved as a gas in the cleaning liquids contained in the cleaning tanks. The dissolved nitrogen-gas concentrations were 8 ppm, 10 ppm, 12 ppm, 14 ppm, and 16 ppm.

Other than the dissolved gas concentrations, the wafers were subjected to the ultrasonic cleaning process under general conditions. For example, a time period for generating ultrasonic waves was 10 minutes. 4,000 particles had been uniformly adhered in advance to the test wafers used in this experiment. There was used in this experiment a cleaning tank, as shown in FIGS. 1 and 2, which can receive a plurality of wafers and is provided with cleaning nozzles disposed on lower side parts of the tank for supplying cleaning liquids.

Figure 12:
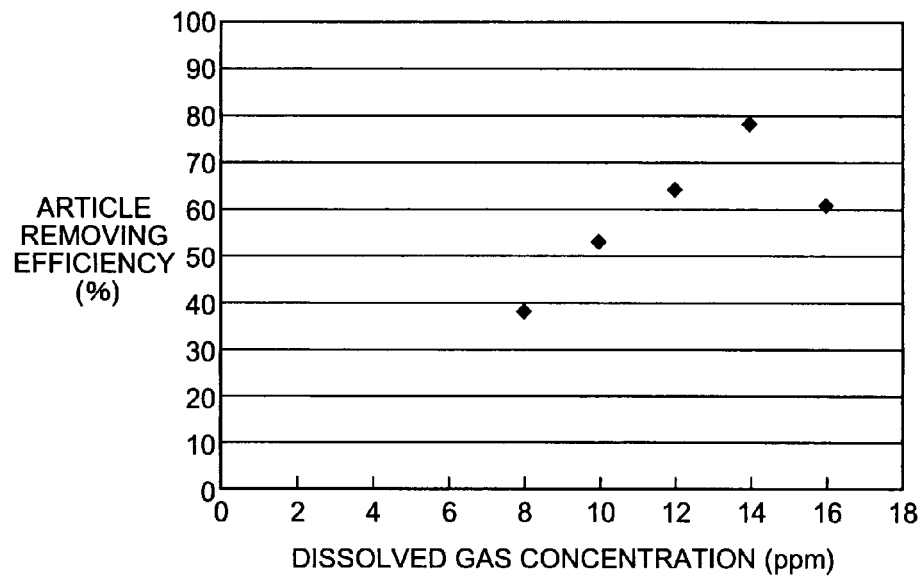
FIG. 12 is a diagram for explaining a relation between a dissolved gas concentration and a particle removing efficiency.
Figure 13:
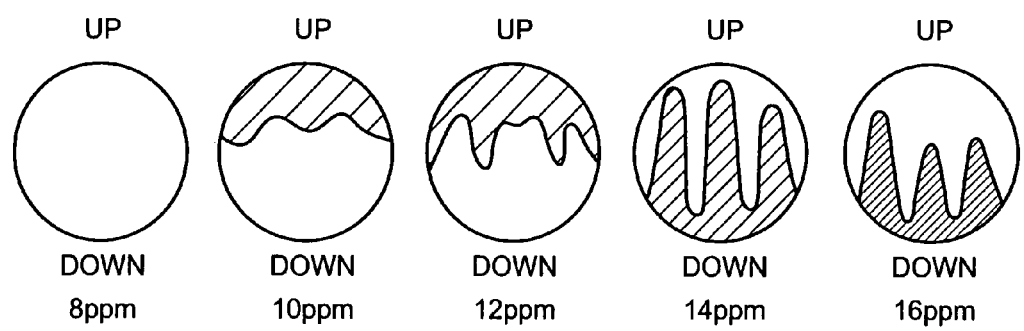
FIG. 13 is a diagram for explaining a relation between a dissolved gas concentration and an area in a wafer of a high particle removing efficiency.

Experiment results are shown in Table 1, and FIGS. 12 and 13. Table 1 and FIG. 12 respectively show a relation between the dissolved gas concentration and a particle removing efficiency at each dissolved gas concentration (i.e., the particle removing efficiency=(the number of particles remaining on the test wafer after the ultrasonic cleaning)/4,000×100(%)). After the ultrasonic cleaning process, where the particles on the test wafers had been removed at a high removing efficiency was observed. FIG. 13 shows the results. In FIG. 13, the shaded portions depict areas which are observed that the particles were removed at high removing efficiency. A density of diagonal lines in the shaded portions is substantially in proportion to the removing efficiency of the observed area. The arrangement of each test wafer in the plane of FIG. 13 corresponds to the arrangement of the test wafer in the cleaning tank. Namely, a lower part of the test wafer in the plane of FIG. 13 was oriented downward in the cleaning tank (near the vibrating members of the ultrasonic generator) during the ultrasonic cleaning process.

TABLE 1

Experiment Results of Experiment 1

| | Dissolved Gas Concentration (ppm) | | | | |
|---|---|---|---|---|---|
| | 8 | 10 | 12 | 14 | 16 |
| Particle Removing Efficiency (%) | 38.2 | 53.5 | 64.4 | 78.9 | 60.5 |

As understood from Table 1 and FIG. 12, when the dissolved gas concentration was 14 ppm, the particles were removed at the highest removing efficiency. In accordance with an increase in the dissolved gas concentrations from 8 ppm to 14 ppm, the particle removing efficiency was improved (increased).

As shown in FIG. 13, in the cases where the dissolved gas concentrations were 14 ppm and 16 ppm, the lower portions of the test wafers, i.e., the areas near the vibrating members of the ultrasonic generator, were cleaned at a high particle removing efficiency. As apparent from FIG. 13, in the cases where the dissolved gas concentrations were 14 ppm and 16 ppm, the areas of the test wafers positioned above the bar members of the holding member had a degraded particle removing efficiency.

As shown in FIG. 13, in the cases where the dissolved gas concentrations were 10 ppm and 12 ppm, the upper portions of the test wafers, i.e., the areas apart from the vibrating members of the ultrasonic generator, were cleaned at a high particle removing efficiency. In the case where the dissolved gas concentration was 8 ppm, a large amount of particles remained on the entire surface of the test wafer. There was found no area in which the particles were removed at a higher removing efficiency, as compared with another area of the same test wafer.

Experiment 2

The following experiment was conducted as an example of the present invention. A test wafer was subjected to the ultrasonic cleaning process in a cleaning liquid whose dissolved gas concentration was 14 ppm for five minutes. Following thereto, the dissolved gas concentration of the cleaning liquid contained in the cleaning tank was lowered to 12 ppm. Thereafter, the test wafer was subjected to the ultrasonic cleaning process in the cleaning liquid whose dissolved gas concentration was 12 ppm for five minutes. Except for this change in the dissolved gas concentrations, the conditions were the same as those in Experiment 1. Similar to Experiment 1, there was used a test wafer to which 4,000 particles had been uniformly adhered in advance.

The experiment results are shown in Table 2. Table 2 also shows, as Comparative Example, the particle removing efficiency of the case where the dissolved gas concentration is 14 ppm in Experiment 1.

TABLE 2

Experiment Results of Experiment 2

| | Example | Comparative Example |
|---|---|---|
| Dissolved Gas Concentration (ppm) | 14 → 12 | 14 (constant) |
| Particle Removing Efficiency (%) | 96.6 | 78.9 |

As shown in Table 2, when the wafer was subjected to the ultrasonic cleaning process in the cleaning liquids having different dissolved gas concentrations, the particle removing ratio was significantly enhanced. The surface of the test wafer which had been cleaned under the conditions of Experiment 2 was observed, and it was found that the particles were uniformly removed therefrom.

The invention claimed is:
1. A substrate cleaning system comprising:
a cleaning tank that contains a cleaning liquid and accommodates a semiconductor wafer in an upstanding manner;
an ultrasonic generator that generates ultrasonic waves in the cleaning liquid contained in the cleaning tank from therebelow while the semiconductor wafer is kept upstanding;
a first supply pipe connected to the cleaning tank so as to supply a first cleaning liquid, having a gas dissolved therein, into the cleaning tank from therebelow;
a second supply pipe connected to the cleaning tank separately from the first supply pipe so as to supply into the cleaning tank from therebelow a second cleaning liquid having the gas dissolved therein at a dissolved gas concentration different from the dissolved gas concentration of the first cleaning liquid; and
a control device for controlling a flow rate of the first cleaning liquid supplied into the cleaning tank, a flow rate of the second cleaning liquid supplied into the cleaning tank, and the generation of ultrasonic waves by the ultrasonic generator to clean the semiconductor wafer while the liquids are being supplied into the cleaning tank and are overflowing from an open upper end of the cleaning tank,
the control device being programmed to cause, while the semiconductor wafer is being cleaned, the ultrasonic generator to generate ultrasonic waves for a period of time, then stop the generation of ultrasonic waves for an intermission, and then, during the intermission, reduce the dissolved gas concentration of the cleaning liquids contained in the cleaning tank, or to cause, while the semiconductor wafer is being cleaned, reduction in the dissolved gas concentration of the cleaning liquids con- tained in the cleaning tank while ultrasonic waves continue to be generated by the ultrasonic generator in the cleaning liquids.

2. The substrate cleaning system according to claim 1, wherein the dissolved gas concentration of the first cleaning liquid is the saturated concentration, and the dissolved gas concentration of the second cleaning liquid is 0 ppm.

3. The substrate cleaning system according to claim 1 further comprising:

a dissolving device placed in the first supply pipe; and a branching pipe connected to the second supply pipe and the first supply pipe so as to allow a part of the second cleaning liquid flowing through the second supply pipe to separately flow into the first supply pipe, wherein the dissolving device generates the first cleaning liquid by dissolving the gas in the part of the second cleaning liquid.

* * * * *